(12) United States Patent
Lin et al.

(10) Patent No.: US 9,455,007 B2
(45) Date of Patent: Sep. 27, 2016

(54) WORD LINE DRIVER CIRCUITRY AND COMPACT MEMORY USING SAME

(71) Applicant: MACRONIX INTERNATIONAL CO., LTD., Hsinchu (TW)

(72) Inventors: Yu-Tsung Lin, Taoyuan (TW); Chien-Hung Liu, Taipei (TW); Jyun-Siang Huang, Chiayi (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 34 days.

(21) Appl. No.: 14/556,512

(22) Filed: Dec. 1, 2014

(65) Prior Publication Data

US 2016/0155484 A1 Jun. 2, 2016

(51) Int. Cl.
*G11C 8/00* (2006.01)
*G11C 8/08* (2006.01)
*G11C 8/10* (2006.01)

(52) U.S. Cl.
CPC .. *G11C 8/08* (2013.01); *G11C 8/10* (2013.01)

(58) Field of Classification Search
CPC ............. G11C 8/12; G11C 7/18; G11C 8/10; G11C 8/08
USPC ........................................ 365/230.03, 230.06
See application file for complete search history.

(56) References Cited

U.S. PATENT DOCUMENTS

| | | | |
|---|---|---|---|
| 6,906,940 B1 | 6/2005 | Lue | |
| 7,177,169 B2 | 2/2007 | Scheuerlein | |
| 7,180,785 B2 | 2/2007 | Kurihara | |
| 7,315,474 B2 | 1/2008 | Lue | |
| 7,420,242 B2 | 9/2008 | Lung | |
| 7,616,487 B2 | 11/2009 | Cho | |
| 7,696,559 B2 | 4/2010 | Arai et al. | |
| 7,700,997 B2 | 4/2010 | Futatsuyama et al. | |
| 7,851,849 B2 | 12/2010 | Kiyotoshi | |
| 8,363,476 B2 | 1/2013 | Lue et al. | |
| 8,363,505 B2 | 1/2013 | Chang et al. | |
| 8,467,219 B2 | 6/2013 | Lue | |

(Continued)

FOREIGN PATENT DOCUMENTS

EP 2048709 A2 4/2009

OTHER PUBLICATIONS

Chen, Chih-Ping, et al., "A Highly Pitch Scalable 3D Vertical Gate (VG) NAND Flash Decoded by a Novel Self-Aligned Independently Controlled Double Gate (IDG) String Select Transistor (SSL)", Jun. 12-14, 2012, 2012 Symposium on VLSI Technology (VLSIT), pp. 91-92.

(Continued)

*Primary Examiner* — Huan Hoang
(74) *Attorney, Agent, or Firm* — Haynes Beffel & Wolfeld LLP

(57) ABSTRACT

A memory device includes a memory array having a plurality of rows and columns of array blocks disposed in array block areas, array blocks including sub-arrays of memory cells arranged in rows and columns with word lines disposed in a patterned gate layer along the rows and one or more patterned conductor layers including bit lines disposed along the columns. A plurality of sets of local word line drivers is arranged in rows and columns disposed adjacent to corresponding array blocks. A set of global word line drivers driving global word lines disposed in an overlying patterned conductor layer over the one or more patterned conductor layers in the array blocks.

20 Claims, 5 Drawing Sheets

(56) References Cited

U.S. PATENT DOCUMENTS

| | | | |
|---|---|---|---|
| 8,503,213 | B2 | 8/2013 | Chen et al. |
| 8,654,591 | B2 | 2/2014 | Akaogi |
| 8,759,899 | B1 | 6/2014 | Lue et al. |
| 2005/0280061 | A1 | 12/2005 | Lee |
| 2005/0286285 | A1 | 12/2005 | Lee et al. |
| 2007/0045708 | A1 | 3/2007 | Lung |
| 2007/0252201 | A1 | 11/2007 | Kito et al. |
| 2008/0073635 | A1 | 3/2008 | Kiyotoshi et al. |
| 2008/0175032 | A1 | 7/2008 | Tanaka et al. |
| 2008/0180994 | A1 | 7/2008 | Katsumata et al. |
| 2009/0097321 | A1 | 4/2009 | Kim et al. |
| 2009/0184360 | A1 | 7/2009 | Jin et al. |
| 2010/0270593 | A1 | 10/2010 | Lung et al. |
| 2012/0119283 | A1 | 5/2012 | Lee et al. |
| 2012/0182806 | A1 | 7/2012 | Chen et al. |
| 2012/0309156 | A1* | 12/2012 | Ohgami .......... G11C 5/063 438/299 |
| 2013/0100758 | A1 | 4/2013 | Chen et al. |
| 2013/0148445 | A1 | 6/2013 | Chen et al. |
| 2014/0226427 | A1 | 8/2014 | Kim et al. |
| 2014/0254284 | A1 | 9/2014 | Hung et al. |

OTHER PUBLICATIONS

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 10-12, 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai, Erh-Kun, et al., "A Multi-Layer Stackable Thin-Film Transistor (TFT) NAND-Type Flash Memory," Electron Devices Meeting, IEDM 2006, Int'l Dec. 11-13, 2006, 4 pages.

Lue, H-T. et al., "A Highly Scalable 8-Layer 3D Vertical-Gate (VG) TFT NAND Flash Using Junction-Free Buried Channel BE-SONOS Device," Jun. 15-17, 2010 Symp. on VLSI Technology, Digest of Technical Papers, pp. 131-132.

Nowak et al., "Intrinsic fluctuations in Vertical NAND flash memories," 2012 Symposium on VLSI Technology, Digest of Technical Papers, pp. 21-22, Jun. 12-14, 2012.

Tanaka H., et al., "Bit Cost Scalable Technology with Punch and Plug Process for Ultra High Density Flash Memory," Jun. 12-14, 2007 Symp. VLSI Tech., Digest of Tech. Papers, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

\* cited by examiner

WORD LINE DRIVER CIRCUITRY AND COMPACT MEMORY USING SAME

BACKGROUND

1. Technological Field

The present technology relates to integrated circuit memory technology, and to word line driver configurations for integrated circuit memory.

2. Description of Related Art

High density memory devices are often laid out with high density memory in a memory area on a substrate, and peripheral circuits in a peripheral area on the substrate. The high density memory includes memory cells with word lines along the rows of memory cells, and bit lines along columns. The word lines are disposed in a patterned gate layer in the memory area, and the memory cells are connected to peripheral circuits using one or more patterned conductor layers over the patterned gate layer.

In large-scale systems, the memory arrays are often divided into array blocks and, as a result, the memory areas are divided into rows and columns of smaller areas. Some of the peripheral circuitry, such as word line drivers, is disposed in areas between the array blocks. In this manner, the word lines and other connectors used in each array block can connect to peripheral circuits along shorter lengths of conductors which can increase speed of operation, and save power.

Word line drivers operate with high speed in modern devices, and therefore require significant power levels. To achieve these goals, some memory architectures use global word line drivers and local word line drivers. The global word line driver is decoded to select an array block and to provide power signals to local word line drivers at each array block. A local word line driver is connected to each word line in an array block, and disposed adjacent to the array block. The local word line driver provides for selecting individual word lines within the array block utilizing the power signals from the global word line driver. One example of a local word line/global word line structure is described in United States Patent Application Publication No. US2013/0100758, entitled Local Word Line Driver, by Chen et al., published 25 Apr. 2013, which application is incorporated by reference as if fully set forth herein. In the example described in Publication No. US2013/0100758, both the local word lines and the global word lines are disposed in areas between the array blocks. Thus, while this configuration improves the efficiency of the distribution of power, and the speed of operation of the devices, it requires significant areas for peripheral circuitry to be disposed within the memory areas on the substrate. Also, the use of global word line drivers and local word line drivers increases the complexity of the patterned conductor layers. In high density circuitry, high complexity of patterned conductor layers can contribute to reductions in yield.

It is desirable to provide a compact and reliable architecture for memory devices utilizing global word line/local word line configurations.

SUMMARY

A technology is described which can improve the manufacturing yield and reduce the area of high density memory devices.

In one aspect of the technology, the memory is described. The memory comprises a memory array having array blocks arranged in a plurality of rows and columns. The array blocks include sub-arrays of memory cells arranged in rows and columns with word lines disposed in a patterned gate layer along the rows and one or more patterned conductor layers including bit lines disposed along the columns. A plurality of sets of local word line drivers are arranged in rows and columns adjacent corresponding array blocks. Conductors in the local word line drivers which are disposed in one or more patterned conductor layers are connected to respective word lines in the corresponding array blocks. A set of global word line drivers is disposed in a global word line driver area in a column parallel with the columns of array blocks. The global word line drivers drive global word lines which are disposed in an overlying patterned conductor layer over the one or more patterned conductor layers used in the array blocks. Each global word line is connected to a group of local word line drivers along a row of the sets of local word line drivers.

By disposing global word line drivers in a column parallel with the columns of array blocks, and in using them to drive a plurality of columns of local word line drivers, area on the integrated circuit is saved. Also, wiring yield is improved, by providing a noncritical route for connection of the local word line drivers to appropriate circuitry in the array. Finally, the layout of critical conductors used for connecting the local word line drivers to the array blocks can be simplified, improving yield.

Other aspects and advantages of the technology described herein can be seen on review of the drawings, the detailed description and the claims, which follow.

DETAILED DESCRIPTION

A detailed description of embodiments of the technology is provided with reference to the FIGS. 1-6.

Figure 1:
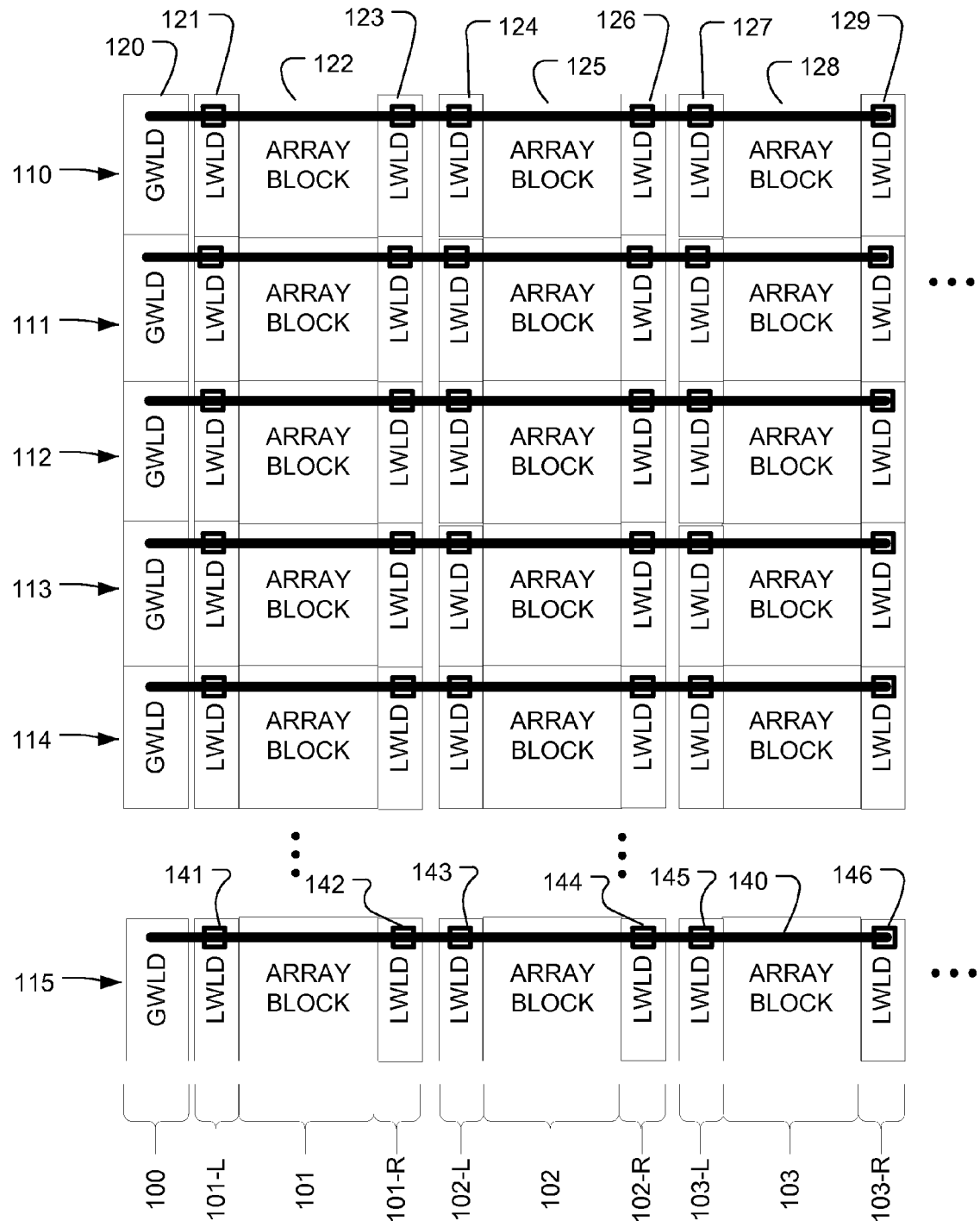
FIG. 1 is a simplified diagram of a layout of a memory array including overlying global word lines as described herein.

FIG. 1 is a simplified layout of a memory device which includes a plurality of array blocks (e.g. 122, 125, 128) arranged in rows 110 111, 112, 113, 114, . . . , 115 and columns 101, 102, 103, . . . . It will be appreciated that the numbers of rows and columns in this example are used for the purposes of description. Actual implementations will utilize one or more rows and one or more columns as suits the designer.

Each of the blocks includes a sub-array of memory cells with word lines and bit lines and other wiring used to connect memory cells to peripheral circuitry. The layout includes local word line driver areas LWLD which are disposed in columns 101-L, 101-R, 102-L, 102-R, 103-L, 103-R, . . . , between the columns of array blocks. The layout includes global word line driver areas GWLD which are disposed in a column 100 adjacent the columns of array blocks. In some examples, there may be many columns of array blocks. Global word line drivers (e.g. 120) may be configured to drive local word line drivers for one or more array blocks in a row that includes groups of two or more local word line driver columns. Also, the global word line drivers may be configured to drive local word line drivers for at least one array block, where the array block has local word line drivers disposed on two sides. The global word line driver areas can be distributed among the columns so that they are adjacent their corresponding groups of array block columns.

A plurality of sets of local word line drivers (e.g. 121, 123, 124, 126, 127, 129, . . . ) is disposed in the columns of local word line driver areas, and includes local word line drivers connected to the local word lines in the adjacent array blocks. Thus, the local word line drivers in the set 121 are connected to respective word lines in the array block 122. The local word line drivers in the set 123 are connected to respective word lines also in the array block 122. Likewise, the local word line drivers in the set 124 are connected to respective word lines in the array block 125. The local word line drivers in the set 126 are connected to respective word lines also in the array block 125. Also, the local word line drivers in the set 127 are connected to respective word lines in the array block 128. The local word line drivers in the set 129 are connected to respective word lines also in the array block 128.

A set of global word lines (e.g. 140) is connected to the set of global word line drivers in the column of global word line driver areas. The global word lines extend across the rows of the array blocks, and connect to the sets of local word line drivers in more than one of the columns of local word line driver areas between the array blocks. Thus, as illustrated FIG. 1, interlayer connector 141 connects the global word line 140 to the local word line driver in row 115, column 101-L. Interlayer connector 142 connects the global word line 140 to the local word line driver in row 115, column 101-R. Interlayer connector 143 connects the global word line 140 to the local word line driver in row 115, column 102-L. Interlayer connector 144 connects the global word line 140 to the local word line driver in row 115, column 102-R. Interlayer connector 145 connects the global word line 140 to the local word line driver in row 115, column 103-L. Interlayer connector 146 connects the global word line 140 to the local word line driver in row 115, column 103-R.

In this configuration, the sets of local word line drivers that are adjacent to a particular array block are connected in common to a global word line driver though a shared global word line.

In this configuration, the global word line drivers are decoded drivers in the sense that they are controlled by address signals, and can be utilized to select a plurality of array blocks arranged along a row in the array of array blocks. The local word line drivers adjacent each array block are also decoded drivers in the sense that they are controlled by address signals, and can be utilized to select a particular word line within each selected array block.

Figure 2:
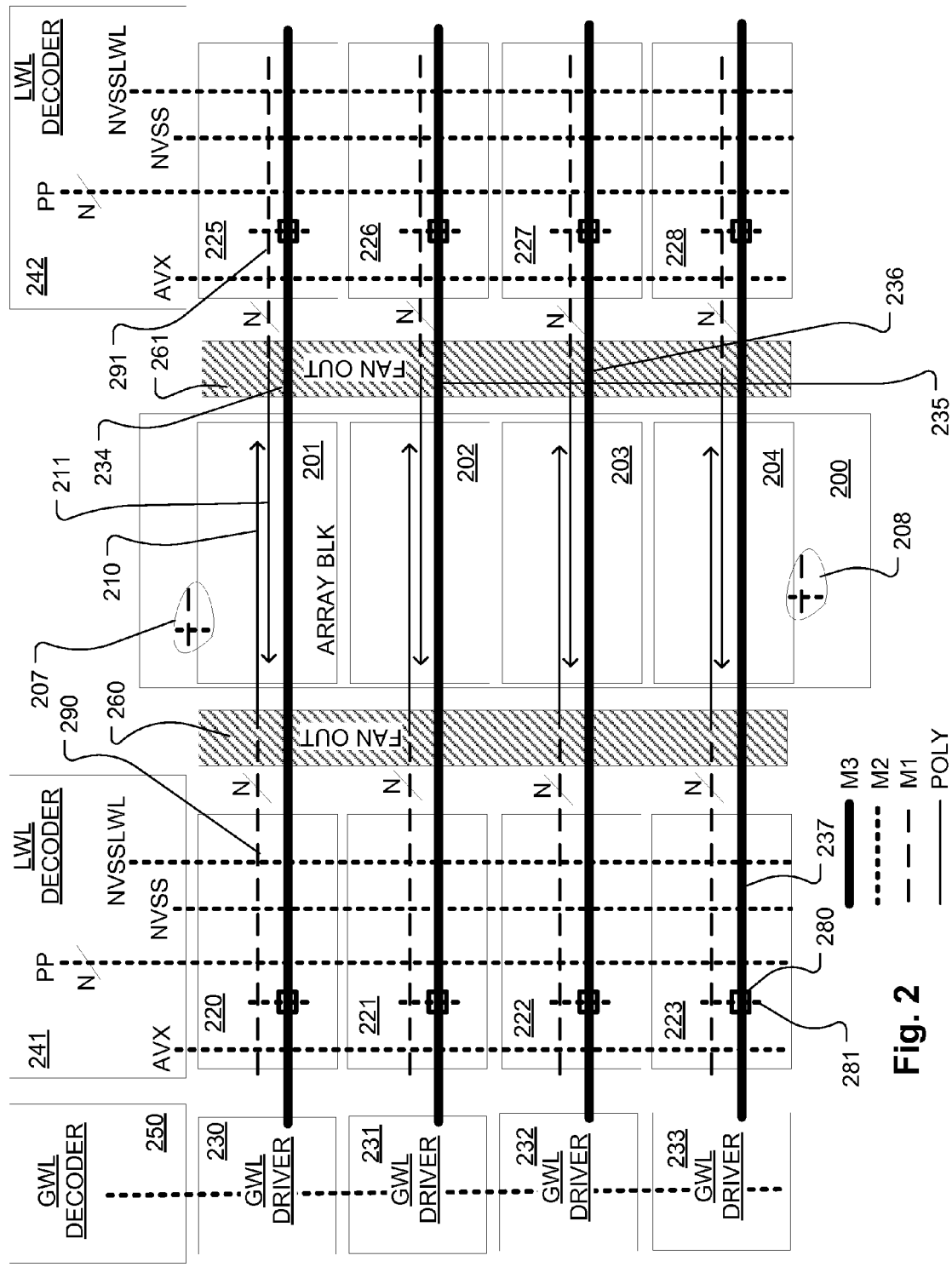
FIG. 2 is a simplified diagram illustrating layout and wiring patterns used to implement an array like that shown in FIG. 1.

FIG. 2 illustrates a layout of a portion of a memory array including global word lines which extend across array blocks for connection to the local word line drivers for a plurality of array blocks along a row. In the illustrated example, only one column of array blocks as illustrated. In embodiments described herein, a plurality of columns of array blocks can be coupled to the same global word line in a manner like that described with reference to FIG. 1.

The memory array is disposed in a memory area 200 that includes a plurality of array blocks 201, 202, 203, 204 arranged in a column, and other array blocks arranged in rows (not illustrated). A set of local word line drivers is disposed in a local word line driver area adjacent to the corresponding array blocks. Thus, a set of local word line drivers for local word lines in the array block 201 is disposed in local word line driver area 220 which drives local word lines extending from the left to the right. A set of local word line drivers for local word lines in the array block 201 is disposed in local word line driver area 225 which drives local word lines extending from the right to the left. In this example, local word line driver areas are disposed on both the left and right sides of each array block. This layout can be used to simplify the arrangement of local word line drivers in the local word line driver areas in order to match the word line pitch. In other embodiments, local word line driver areas for a given array block can be disposed on only one side.

A similar pattern is implemented for each of the array blocks 202, 203, 204 illustrated in the diagram. The same pattern can be implemented for each column of array blocks in embodiments of the invention including a plurality of columns in the plurality of rows.

Thus, for the embodiment in this figure, a set of local word line drivers for local word lines in the array block 202 is disposed in local word line driver area 221 which drives local word lines extending from the left to the right. A set of local word line drivers for local word lines in the array block 202 is disposed in local word line driver area 226 which drives local word lines extending from the right to the left. A set of local word line drivers for local word lines in the array block 203 is disposed in local word line driver area 222 which drives local word lines extending from the left to the right. A set of local word line drivers for local word lines in the array block 203 is disposed in local word line driver area 227 which drives local word lines extending from the right to the left. A set of local word line drivers for local word lines in the array block 204 is disposed in local word line driver area 223 which drives local word lines extending from the left to the right. A set of local word line drivers for local word lines in the array block 204 is disposed in local word line driver area 228 which drives local word lines extending from the right to the left.

The layout of this figure includes global word line driver areas 230, 231, 232, 233 arranged in a column to the left of the array block areas. In embodiments described herein, there can be one column of global word line driver areas for each group of columns of local word line drivers or array blocks which share a global word line. For example, local word line drivers for two columns of array blocks can share a single global word line in some embodiments. In other embodiments, local word line drivers for eight columns of array blocks can share a single global word line. The number of columns in a group of columns of local word line drivers which share a global word line according to the technology described herein is greater than one, and can be any number that suits the layout requirements for the system being designed.

As shown in FIG. 2, a fanout area 260, 261 is disposed between the columns of local word line driver areas and the adjacent array blocks. In the fanout areas 260, 261, conductors carrying the local word line signals from the local word line drivers are connected to the word line conductors which extend through the array area. Thus, in one example, the conductors carrying the local word line signals from the local word line drivers can be implemented in one of the patterned metal layers, while the word line conductors which extend through the array area are implemented in a patterned gate layer which can comprise polysilicon. Interlayer conductors are laid out in the fanout areas to make the connections between the patterned metal layers in the polysilicon.

FIG. 2 schematically illustrates the routing of the patterned conductor layers for the word lines, local word line drivers and global word line drivers. A legend in the diagram shows the dash patterns used for lines representing each of the patterned conductor layers described, which include a polysilicon layer POLY, and three patterned metal layers M1, M2 and M3. In other examples, the polysilicon layer can be implemented using other word line or gate materials, including metal. Likewise, the patterned metal layers can be implemented using any type of conductor material which is suitable for the device being implemented.

In the memory area 200, the patterned gate layer POLY and one or more patterned conductor layers as represented by the symbols 207, 208 are used for connecting memory cells in the array blocks to peripheral circuitry. One or more of the patterned conductor layers in the memory area 200 can be utilized to implement bit lines, which can be implemented as a dense pattern of vertical conductors having critical dimensions for the purposes of determining memory performance.

As described herein, each global word line driver 230, 231, 232, 233 drives a respective global word line 234, 235, 236, 237 which in this example is implemented in metal layer M3. The patterned conductor layer (e.g. metal layer M3) which includes the global word line 234, 235, 236, 237 overlies the one or more patterned conductor layers (207, 208) used for connecting memory cells to peripheral circuitry in the memory area 200. In some embodiments, the global word line is disposed in a patterned conductor layer which overlies the patterned conductor layer used to implement bit lines in the memory area 200. Any number of patterned conductor layers can be utilized in various arrangements.

In the illustrated example, a global word line decoder 250 is connected to the global word line drivers in a column using a conductor in a patterned conductor layer such as one or more of the patterned conductor layers that are also used in the memory area. In this example, a conductor in the M2 layer is illustrated for this connection. The conductor can carry one or more address signals to the global word line drivers.

Figure 3:
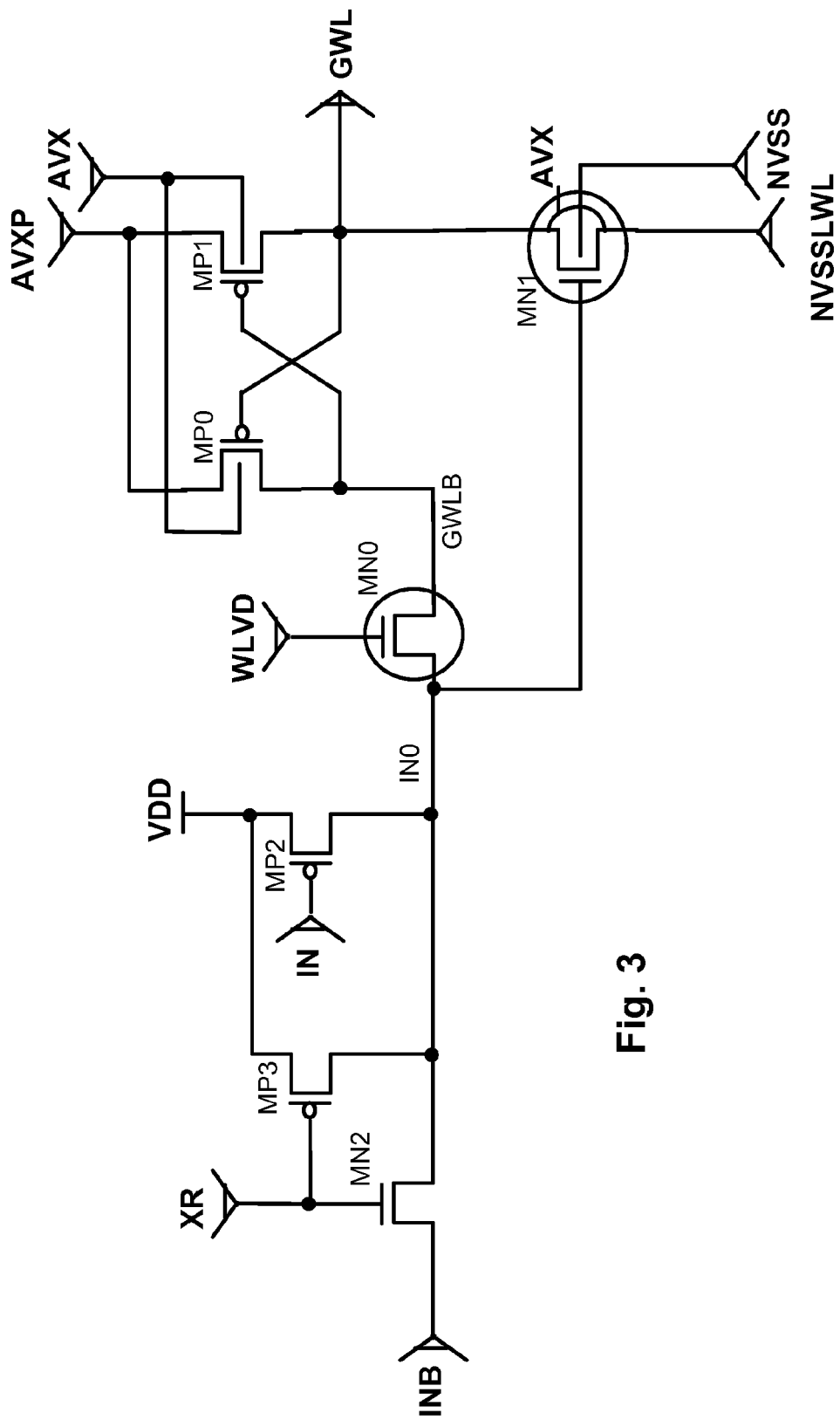
FIG. 3 is a schematic diagram of a global word line driver, which can be utilized in devices like that shown in FIGS. 1 and 2.

An example of a global word line decoder is illustrated in FIG. 3, and described below.

Local word line decoders 241, 242 are disposed over the columns of local word line driver areas. The local word line decoders 241 are connected to local word line drivers in the same column using patterned conductor layers such as one or more of the patterned conductor layers that are also used in the memory area. In this example, conductors in the M2 layer are illustrated for connection of power signals, bias signals and address signals or other control signals from the local word line decoder 241 to the local word line drivers in the areas 220, 221, 222, 223. Likewise, conductors in the M2 layer are illustrated for connection of power signals, bias signals and address signals or other control signals from the local word line decoder 242 to the local word line drivers in the areas 225, 226, 227, 228.

Each of the local word line drivers in the local word line driver areas drives a local word line conductor (e.g. 290, 291) in one of the patterned conductor layers such as the layer M1 in this example. In some embodiments, the local word line conductors can be disposed in more than one of the patterned conductor layers, such as both layer M1 and layer M2. As illustrated, there are a number N of local word line drivers in each of the local word line driver areas, which drive the corresponding number N of local word lines, which are connected to the word lines in the patterned gate layer (e.g. 210, 211) which extend through the array block. In the illustrated example, with local word line drivers on both sides of each array block, the array block includes 2N word lines.

Thus, an array block for the purposes of this description is constituted by a sub-array of memory cells arranged in rows and columns with word lines disposed in a patterned gate layer along the rows and one or more patterned conductor layers including bit lines disposed along the columns. The sub-array includes the number of word lines (e.g. 2N) that is served by the local word line drivers in the set of local word line drivers in the corresponding local word line driver areas, and is driven by a single global word line. The number N can range from 4 upwards to 32, 64, 128 or more, depending on the needs of a particular implementation.

The signals provided by the local word line decoders 241, 242 to the corresponding local word line drivers include power signals, bias signals, address signals or other control signals needed to drive the local word line drivers, where a power signal is defined for the purposes of this description as a signal which is provided to a current-carrying terminal in the local word line driver. In this example, the power signal designated NVSSLWL is provided from the local word line decoders on a patterned metal line to the local word line drivers. A set of address signals PP (i.e., control signals derived from an address that identifies a memory location) is provided, including one control signal for each local word line driver in a set of local word line drivers. In some examples, the set of address signals PP is shared among the sets of word line drivers. The address signal PP is used to select one of the local word line drivers in the set of local word line drivers for each array block. The local word line decoders 241, 242 also provide the bias signals AVX and NVSS used in biasing transistors in the local word line decoders, such as described below with reference to FIG. 4.

As shown in FIG. 2, a global word line (e.g. global word line 237) passes over the local word line driver area and the corresponding array block for a group of array blocks arranged along a row in the array. In the local word line driver area (e.g. 223) an interlayer connector 280 connects the global word line 237 to a conductor 281 in a patterned conductor layer, such as layer M2 within the local word line driver area 223. This conductor 281 can connect the power signal GWL on the global word line 237 to current-carrying terminals of the local word line drivers in the set of local word line drivers in the local word line driver area 223.

FIG. 3 is a simplified circuit diagram of a global word line driver, such as one generating a GWL signal as shown in FIGS. 1 and 2. The global word line driver includes a decoder and a level shifter in this example. It produces an output voltage level which depends on the mode of operation of the device (e.g. read, program, erase) and on the address of the memory cell subject of the particular operation.

A decoder is implemented using transistors MN2, MP3, MP2, and MN0. MN2 is an N-type transistor. MN2 has a gate coupled to signal XR, and current-carrying terminals coupled to signals INB and node IN0.

P-type transistor MP3 has a gate coupled to signal XR, and current-carrying terminals coupled to power VDD and node IN0.

P-type transistor MP2 has a gate coupled to signal IN (complement of INB), and current-carrying terminals coupled to power VDD and node IN0.

N-type transistor MN0 has a gate coupled to signal WLVD, and current-carrying terminals coupled to node IN0 and node GWLB.

A level shifter is implemented using P-type transistor MP0, transistor MP1 and transistor MN1. MP0 has a gate coupled to the global word line GWL, and current-carrying terminals coupled to power AVXP and node GWLB.

P-type transistor MP1 has a gate coupled to node GWLB (complement of GWL), and current-carrying terminals coupled to power AVXP and node GWL.

P-type transistors MP0 and MP1 have a body coupled to bias AVX.

N-type transistor MN1 has a gate coupled to node IN0, and current-carrying terminals coupled to node GWL and power NVSSWL. N-type transistor MN1 also has a body coupled to bias NVS and a well coupled to bias AVX.

The global word line driver receives the control signals and address signals for a global word line decoder, and drives the global word line GWL depending on the mode of operation (e.g. read, erase, program) and on the selected array blocks.

Figure 4:
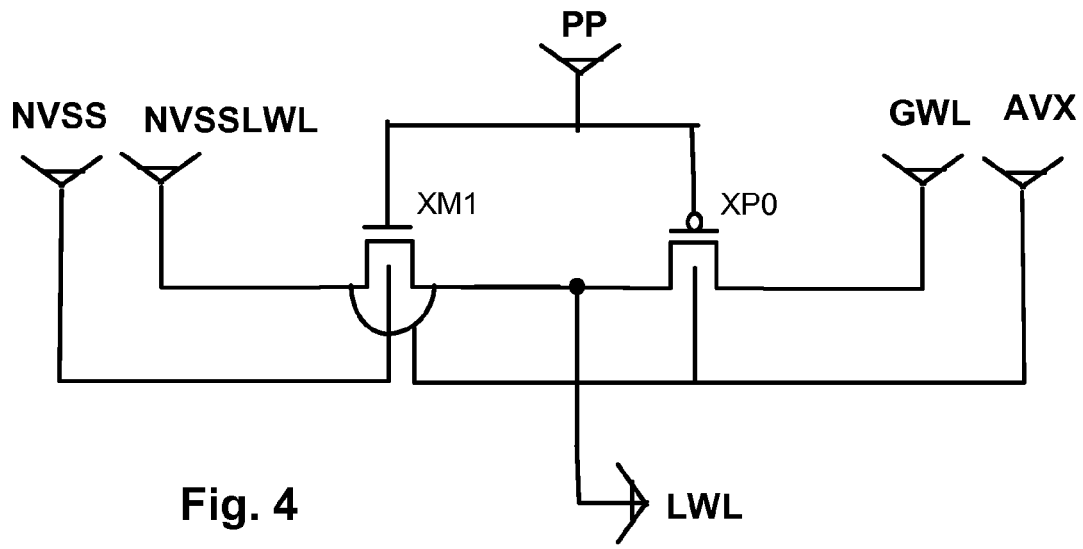
FIG. 4 is a schematic diagram of a local word line driver which can be utilized in devices like that shown in FIGS. 1 and 2.

FIG. 4 shows a circuit diagram of a 2T word line driver as an example of the technology with an inverter including an n-type transistor and a p-type transistor, where during a program operation the input of the inverter receives a positive voltage to discharge a word line coupled to the output of the inverter.

One 2T word line driver is coupled to one word line in the memory array. Transistor MP0 is a p-type transistor. Transistor XM1 is an n-type transistor. Both transistors have a source and a drain which are the current-carrying terminals, and a gate. The gates of p-type transistor MP0 and n-type transistor XM1 are electrically connected to each other, and to address signal PP which is one of two signals selecting a particular word line controlled by a particular local word line driver. The drains of p-type transistor MP0 and n-type transistor XM1 are electrically connected to each other, and to the local word line LWL driven by the word line driver. The source of p-type transistor MP0 is electrically connected to power signal GWL provided from the global word line, which is another address signal in this configuration selecting a particular local word line controlled by a particular local word line driver. The source of n-type transistor XM1 is electrically connected to power signal NVSSLWL. Bias signal NVSS is electrically connected to the p-well of the n-type transistor XM1. The p-well of the n-type transistor XM1 is formed in an n-well, in which the p-type transistor MP0 is formed.

A particular set of local word line drivers shares the same GWL signal but has different PP signals within a column.

This example addressing arrangement selects a particular 2T word line driver from the array, and deselects other 2T word lines drivers according to multiple separate address lines. Both signal PP and signal GWL select a particular word line corresponding to a particular word line driver.

Figure 5:
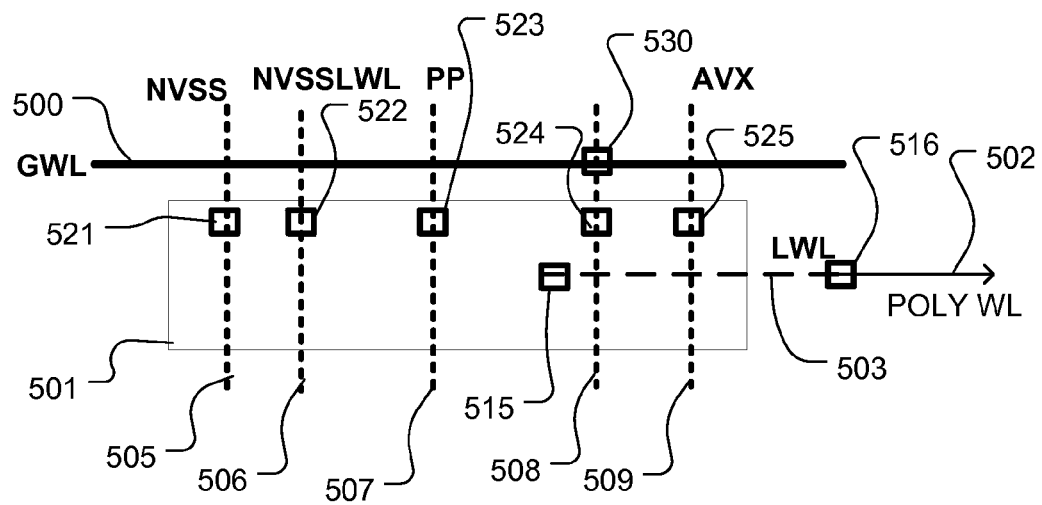
FIG. 5 is a simplified diagram illustrating layout and wiring patterns used for connection to local word line drivers in a device like that shown in FIGS. 1 and 2.

FIG. 5 is a schematic illustration of the wiring structures used for connection to the local word line driver in a set of local word line drivers. As illustrated in FIG. 2, a plurality of signals are provided for control of the local word line driver 501 on conductors 505, 506, 507, 509, implemented in one or more of the patterned conductor layers, which are in turn connected to the local word line driver 501 by the interlayer connectors 521, 522, 523, 525. In this example, the conductors 505, 506, 507, 509 are all implemented in the layer M2. The signals provided include NVSS, NVSSLWL, PP and AVX as discussed above in connection with FIG. 4. A global word line 500 carries the GWL signal, which is coupled to the local word line driver 501 by the interlayer connector 524 to conductor 508, and from conductor 508 through electrically connecting interlayer connector 530. The word line driver includes a conductor 503 connected to its output by interlayer connector 515. The conductor 503 can be in one of the patterned conductor layers such as in layer M1 as illustrated in this example, or in layer M2. Multiple local word line drivers can use different layers for implementation of the conductor 503. The conductor 503 carries the signal LWL output by the local word line driver 501. The conductor 503 is connected by interlayer connector 516 to the local word line 502, made for example of polysilicon, and connected to the gates of memory cells in the array block. The conductor 507 can be connected to all of the local word line drivers in a set of local word line drivers for a given array block. Thus, the conductor 507 can be connected to four, eight, 16 or more local word line drivers. The conductor 507 can be unique to a single local word line driver in a given set, but can be shared by local word line drivers in multiple sets.

The local word line driver 501 can be laid out in a staggered fashion to match the pitch of the local word lines (e.g. 502) in the array. Thus, the local word line driver 501 can have local word line drivers to the left and to the right, which are staggered slightly upwardly and slightly downwardly so that the conductors corresponding to the conductor 503 can be arranged in parallel without turns into the fanout region where they are connected to the poly word lines. In this manner, critical layout feature used to connect the local word line drivers to the polysilicon local word lines in the array can be made simpler, which can lead to greater yields in manufacturing.

Figure 6:
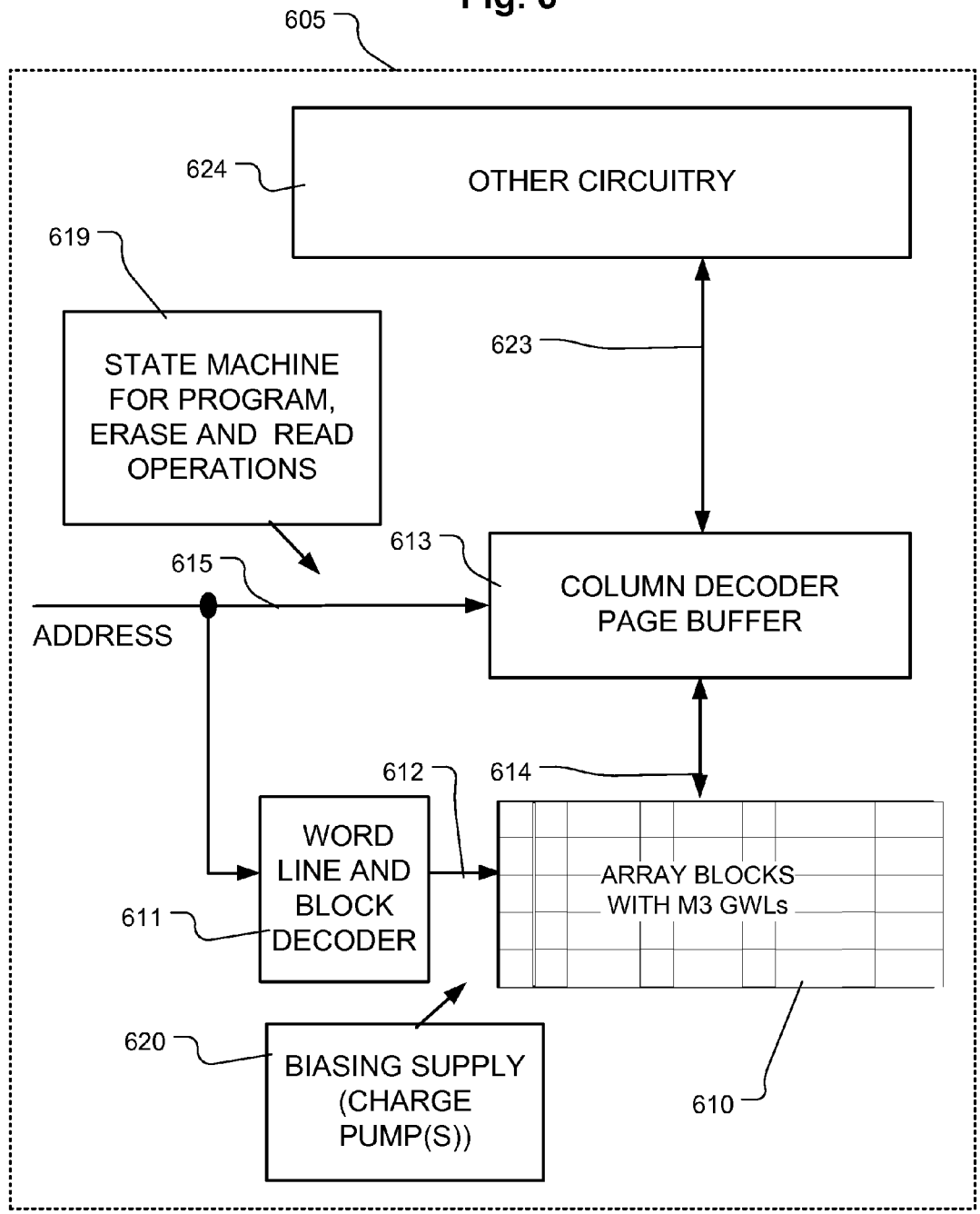
FIG. 6 is a simplified diagram of an integrated circuit memory device, including a memory array like that shown in FIG. 1.

FIG. 6 is a simplified block diagram of an integrated circuit memory 605 incorporating global word lines which overlie the array blocks (e.g. M3 GWLs), and are shared among multiple columns of local word line drivers. In this example, the memory array 610 comprises a NOR flash memory, which is segmented schematically in the diagram to suggest columns of local word line driver areas between columns of array blocks, with a global word line driver column on the left. In other examples, other memory technologies can be used, including DRAM, SRAM, NAND flash, and other array types in architectures. Schematically, a word line driver and block decoder module 611 is coupled by address signals 612 to the global word line drivers and local word line drivers in the array. A column decoder and page buffer module 613 is coupled by conductors 614 to bit lines in the array. Addresses are a provided to the integrated circuit on address line 615, and these addresses are distributed to the decoders in modules 613 and 611. Biasing supply circuits, including charge pumps or other suitable voltage sources and generators, are included in the biasing supply module 620, which provides appropriate signals to the array 610 and other components of the integrated circuit. Other circuitry can be included in module 624, which is connected to the column decoder and page buffer module 613 by conductor 623. The other circuitry can comprise special-purpose logic, a general-purpose processor, programmable gate array logic, or other components. In some examples, the other circuitry in the module 624 can comprise components used for system-on-a-chip implementations. A control module 619 includes a state machine in this example which is configured for program, erase and read operations utilizing the resources on the integrated circuit.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
    a memory array comprising a plurality of rows and columns of array blocks disposed in array block areas, array blocks including sub-arrays of memory cells arranged in rows and columns with word lines disposed in a patterned gate layer along the rows and one or more patterned conductor layers including bit lines disposed along the columns;
    a plurality of sets of local word line drivers arranged in rows and columns, the sets of local word line drivers being disposed adjacent to corresponding array blocks, including conductors in the one or more patterned conductor layers connected to respective word lines in the corresponding array blocks; and
    a set of global word line drivers disposed in a global word line driver area connected to a corresponding set of global word lines, the global word line drivers in the set drive global word lines disposed in an overlying patterned conductor layer over the one or more patterned conductor layers, each global word line connected to a group of local word line drivers along a row of the sets of local word line drivers.

2. The memory of claim 1, wherein the local word line drivers in the sets of local word line drivers comprise two-transistor driver circuits.

3. The memory of claim 1, wherein the global word line drivers in the set of global word line drivers comprise a decoder circuit and a level shifter, and produce a power signal having a selected magnitude.

4. The memory of claim 1, wherein the patterned gate layer comprises polysilicon.

5. The memory of claim 1, wherein the patterned gate layer comprises polysilicon, the one or more patterned conductor layers comprise first and second layers of patterned metal, and the overlying patterned conductor layer comprises a third layer of patterned metal.

6. The memory of claim 5, wherein a local word line driver in the sets of local word line drivers has first and second current-carrying terminals, a gate terminal and an output terminal, and wherein the output terminal is connected to a conductor in the first layer of patterned metal, and the gate and the first and second current-carrying terminals are connected to conductors in the second layer of patterned metal.

7. The memory of claim 6, wherein the conductor in the second layer of patterned metal that is connected to the first current-carrying terminal of the local word line driver is connected to one of the global word lines, which connects the first current-carrying terminal of the local word line driver to a corresponding global word line driver in the set of global word line drivers.

8. The memory of claim 6, wherein the first current-carrying terminals in the local word line drivers in the set of local word line drivers corresponding to a particular array block are all connected to a single global word line driver in the set of global word line drivers.

9. The memory of claim 1, wherein the local word line drivers in the set of local word line drivers for a particular array block in a particular group of array blocks, are distributed between a first local word line area on a first side of the particular array block and a second local word line area on a second side of the particular array block.

10. The memory of claim 1, wherein first and second layers of patterned conductor layers include array wiring connecting elements of the array block to peripheral circuits.

11. A memory comprising:
    a memory array comprising a plurality of rows and columns of array blocks, array blocks including sub-arrays of memory cells arranged in rows and columns with word lines along the rows and bit lines along the columns, and a set of local word line drivers disposed adjacent the array blocks and connected to the word lines;
    local word line decoder circuits coupled to the sets of local word line drivers in a column of the array blocks, and providing a set of local word line select signals in common to the local word line drivers in the sets of local word line drivers in the column;
    a set of global word line drivers produce output signals having selected magnitudes for the sets of local word line drivers; and
    a set of global word lines connected to the set of global word line drivers, the global word lines overlying corresponding rows of the array blocks and connecting the output signals from each corresponding global word line driver to a plurality of sets of local word line drivers disposed adjacent array blocks in the corresponding rows of the array blocks.

12. The memory of claim 11, wherein the local word line drivers in the sets of local word line drivers comprise two-transistor driver circuits having a current-carrying terminal connected to a corresponding global word line, and a gate terminal connected to a local word line select signal.

13. The memory of claim 11, wherein a global word line driver in the set of global word line drivers comprises a decoder circuit and a level shifter.

14. The memory of claim 11, wherein the word lines in the array block are disposed in a first patterned conductor layer, and including:
    second and third patterned conductor layers overlying the first patterned conductor layer in the array blocks; and
    wherein the global word lines are disposed in an additional patterned conductor layer over the second and third patterned conductor layers in the array blocks.

15. The memory of claim 14, wherein the first patterned conductor layer comprises polysilicon.

16. The memory of claim 14, wherein the first patterned conductor layer comprises polysilicon, the second and third patterned conductor layers comprise first and second layers of patterned metal, and the additional patterned conductor layer comprises a third layer of patterned metal.

17. The memory of claim 14, wherein a local word line driver in the sets of local word line drivers has a first current-carrying terminal connected to the global word line, a second current-carrying terminal, a gate terminal and an output terminal, and wherein the output terminal is connected to a conductor in the second patterned metal layer, and the gate and the second current-carrying terminals are connected to conductors in the third patterned metal layer.

18. The memory of claim 17, including conductors in one of the second and third patterned conductor layers which connect the first current-carrying terminals of local word line drivers in the sets of local word line drivers to the corresponding global word lines.

19. The memory of claim 11, wherein the local word line drivers in the set of local word line drivers for a particular array block in a particular group of array blocks, are distributed between a first local word line area on a first side of the particular array block and a second local word line area on a second side of the particular array block.

20. A memory comprising:
- a memory array comprising a plurality of array blocks disposed in rows and columns, array blocks including sub-arrays of memory cells with word lines and bit lines;
- local word line driver areas disposed in columns between array blocks in the rows of array blocks;
- global word line driver areas disposed in a column parallel with the columns of array blocks;
- a plurality of sets of local word line drivers disposed in the columns of local word line driver areas and connected to the word lines in adjacent array blocks;
- a set of global word line drivers disposed in the column of global word line driver areas; and
- a set of global word lines connected to the set of global word line drivers in the column of global word line driver areas, the global word lines extending across rows of array blocks, and connecting to the sets of local word line drivers in the columns of local word line driver areas between array blocks, wherein the global word lines in the set of global word lines are disposed in an overlying patterned conductor layer over one or more patterned conductor layers in the sets of local word line drivers.

* * * * *